United States Patent [19]

Murtojarvi

[11] Patent Number: 5,493,255
[45] Date of Patent: Feb. 20, 1996

[54] BIAS CONTROL CIRCUIT FOR AN RF POWER AMPLIFIER

[75] Inventor: Simo Murtojarvi, Salo, Finland

[73] Assignee: Nokia Mobile Phones Ltd., Salo, Finland

[21] Appl. No.: 407,653

[22] Filed: Mar. 21, 1994

[51] Int. Cl.$^6$ .................................................. H03F 3/68
[52] U.S. Cl. ............................................ 330/296; 330/310
[58] Field of Search .................................. 330/285, 296, 330/300, 310, 311; 455/127

[56] References Cited

U.S. PATENT DOCUMENTS

| | | | |
|---|---|---|---|
| 4,034,308 | 7/1977 | Wermuth et al. | 330/86 |
| 4,257,009 | 3/1981 | Yorkanis | 330/51 |
| 4,486,718 | 12/1984 | Sugawara | 330/296 X |
| 4,901,032 | 2/1990 | Komiak | 330/277 |
| 4,924,191 | 5/1990 | Erb et al. | 330/130 |
| 5,060,294 | 10/1991 | Schwent et al. | 455/93 |
| 5,121,081 | 6/1992 | Hori | 330/279 |
| 5,406,225 | 4/1995 | Iida et al. | 330/296 X |

*Primary Examiner*—Steven Mottola
*Attorney, Agent, or Firm*—Perman & Green

[57] ABSTRACT

An active biasing circuit to provide linear operation of an RF power amplifier. A current generator circuit provides a current to the stages of the RF power amplifier. In the final power amplifier stage the current is applied to a bias control amplifier that includes a transistor connected as a diode. The transistor diode is connected through a resistor to the emitter of a bias control transistor, which is in turn connected to and controls the gate of a transistor power amplifier in the final power amplifier stage of the RF power amplifier with a bias current that is the highest current level needed for highest RF power. The transistor diode and the current generator circuit are also connected to bias control transistors in the other stages of the RF power amplifier such that the other stages are likewise controlled with the current from the current generator.

12 Claims, 2 Drawing Sheets

BIAS CONTROL CIRCUIT FOR AN RF POWER AMPLIFIER

BACKGROUND OF THE INVENTION

1. Field of the Invention

The present invention relates to RF amplifiers for mobile telephone communication systems and more particularly to a biasing circuit to provide linear operation of an RF mobile telephone power amplifier.

2. Description of the Background Art

Reference that relate generally to biasing or controlling amplifiers in radio telephone apparatus are as follows.

In U.S. Pat. No. 4,060,294 issued Oct. 22, 1991 to Schwent et al. and entitled DUAL MODE POWER AMPLIFIER FOR RADIO TELEPHONE, a transmission system is described wherein radio communication signals are both analog mode which are frequency modulated and discrete mode which are composite modulated as a combination of amplitude and phase modulation. In the Schwent et al. patent an amplifier is taught which may be alternately operated in the linear mode for the composite modulation and the saturation mode for the frequency modulation. A switch is provided which is connected to the amplifier to operate it in the linear or the saturation mode.

In U.S. Pat. No. 4,924,191 issued May 8, 1990 to Erb et al. entitled AMPLIFIER HAVING DIGITAL BIAS CONTROL APPARATUS an amplifier is described that includes a digital bias control apparatus to provide dynamic control over the operating point of a plurality of amplifying elements in the amplifier. A processor is provided to optimize the operating point of each amplifying element as a function of the amplifying element characteristics.

In U.S. Pat. No. 4,247,009 issued Mar. 17, 1981 to Yorkanis entitled INHIBIT CIRCUIT FOR A DIFFERENTIAL AMPLIFIER a system is described including a pair of non-additive combiners (mixers) connected at their respective outputs to the inverting, and non-inverting, inputs of differential amplifier. A bias controller having an input for receiving a control signal produces a fixed bias voltage at a first output thereof. A conductor is connected to apply the variable bias voltage at the second output to the first inputs of non-additive combiners. A resistor is connected to apply the fixed vias voltage at the first output of the bias controller to a second input of the combiner.

U.S. Pat. No. 4,901,032 issued Feb. 13, 1990 to Komiak relates to a digitally controlled variable power amplifier for radio frequency signals for driving the individual elements of a phased array radar system in which accurate tapering of the power supplied to individual antenna elements is desired for sidelobe control. The power amplifier must maintain a stable phase transfer response and should remain at a high power transfer efficiency at each reduced power setting. This performance is achieved by the use of power transistor of a segmented dual gate design. The segments of the second gate electrode are of digitally scaled widths and are individually energized to activate digitally scale regions of the transistor. These regions are operated in a saturated class "A" mode in all power settings to achieve the desired stable phase transfer response and high power added efficiency.

U.S. Pat. No. 4,034,308 issued Jul. 5, 1977 to Wermuth et al. entitled AMPLIFIER WITH CONTROLLABLE TRANSMISSION FACTOR AND SWITCHABLE CONTROL CHARACTERISTICS discloses an amplifier circuit whose gain bears a desired relation to a control voltage, including a differential amplifier, a plurality of impedances interconnected between the amplifier terminals and switches interconnected with the impedances and switchable between two states which create two impedance configurations that give the circuit mutually complementary gain vs. control voltage control characteristics.

U.S. Pat. No. 4,121,081 issued Jun. 9, 1992 to Hori entitled OUTPUT WAVEFORM CONTROL CIRCUIT discloses an output waveform control circuit for a time division multiple access system including driving circuit which sends a control signal to a power amplifier in accordance with a signal outputted by a comparator circuit. By controlling the operating voltage of the power amplifier simultaneously with the control of the level input signal from the input level control circuit, the output characteristic of the power amplifier, including a class C or the like amplifier having a non-linear input/output characteristic, is prevented from varying abruptly, and the output waveform of the power amplifier is so controlled as to have gently sloped leading and trailing edges.

In Japanese Patent Publication SS4(1979) 104760 dated Aug. 17, 1979 by Hikari Hond and entitled A LOW POWER CONSUMPTION TYPE AMPLIFIER a low power consumption type amplifier is described that is provided with an amplifier circuit which amplifies a specified wideband signal, a signal level detector circuit which detects the signal level of this amplifier circuit, and a variable-impedance circuit where the impedance is varied and controlled by means of the output of the said signal level detector circuit, and which by way of the said impedance supplies power of a specified voltage to the aforementioned amplifier circuit, thereby controlling the said variable-impedance circuit so that the aforementioned impedance is caused to be small when the aforementioned signal level is high, and high when the signal level is low.

SUMMARY OF THE INVENTION

An object of the present invention is to provide a bias control circuit for a power amplifier.

Another object of the present invention is to provide biasing for linear operation of a power amplifier.

Still another object of the present invention is to provide an RF power amplifier linear biasing circuit using a power level control signal for amplifier current control.

Other and further features, advantages and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE PREFERRED EMBODIMENT

With digitally modulated signals (such as by phase-shift keying etc.) a linear power amplifier is needed. Usually with analog mobile phones RF-power amplifiers are biased in class C. This means that an incoming RF-signal is needed in order to make the transistor in the amplifier conduct. This technique is simple, but with signals containing AM-modulation a marked distortion occurs. In order to keep the distortion low the RF-stages have to be biased to a current level sufficient that the needed RF-power can be achieved with low distortion. Bipolar transistors have quite large variation in DC current gain (hfe). To get the amplifier stage biased at the desired current without too high of a voltage drop in the DC feedback circuit (collector resistor) an active biasing circuit is needed. Typically a PNP transistor is used in the feedback circuit of the amplifier stage The PNP transistor controls the base current of the RF-transistor so that the voltage drop over the RF-transistor's collector resistor equals the voltage (Vbat-Vbpnp)-Vbepnp where Vbpnp is the voltage at the base of the PNP transistor and Vbepnp is the base emitter voltage of the PNP transistor. If a low voltage drop is needed, the temperature dependence of Vbepnp makes the biasing circuit dependent on temperature. To avoid this, temperature compensation is needed. Temperature compensation may be accomplished with a pnp transistor connected as a diode. With these circuit techniques it is possible to bias the RF-power amplifier into linear operation. Cellular phones use several power levels, so if the power amplifier is biased for the highest power level, the efficiency with lower power levels is very low.

Figure 1:
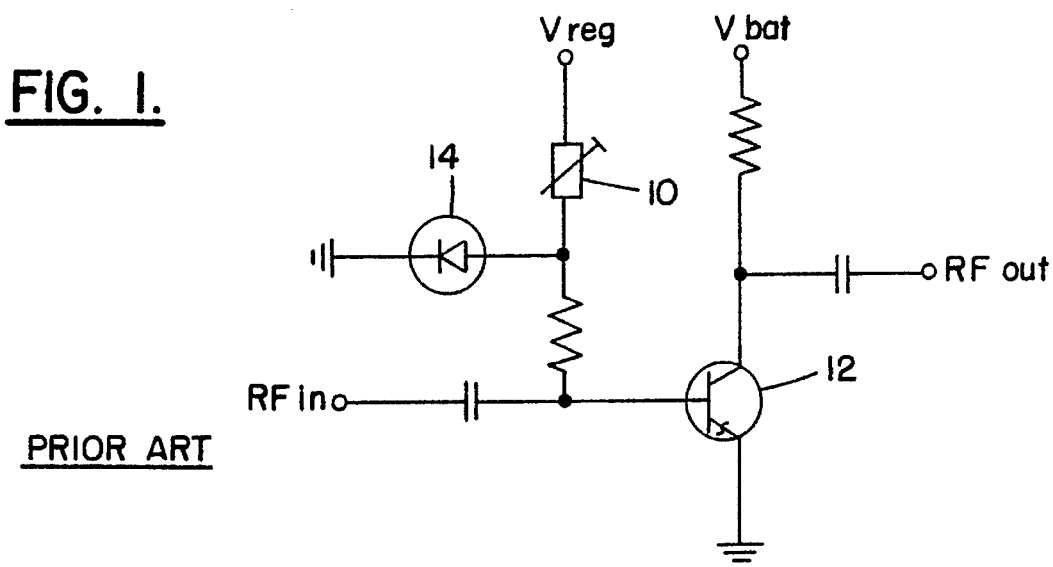
FIGS. 1, 2 and 3 are schematic illustrations of known circuits for RF power amplifier bias control.
Figure 2:
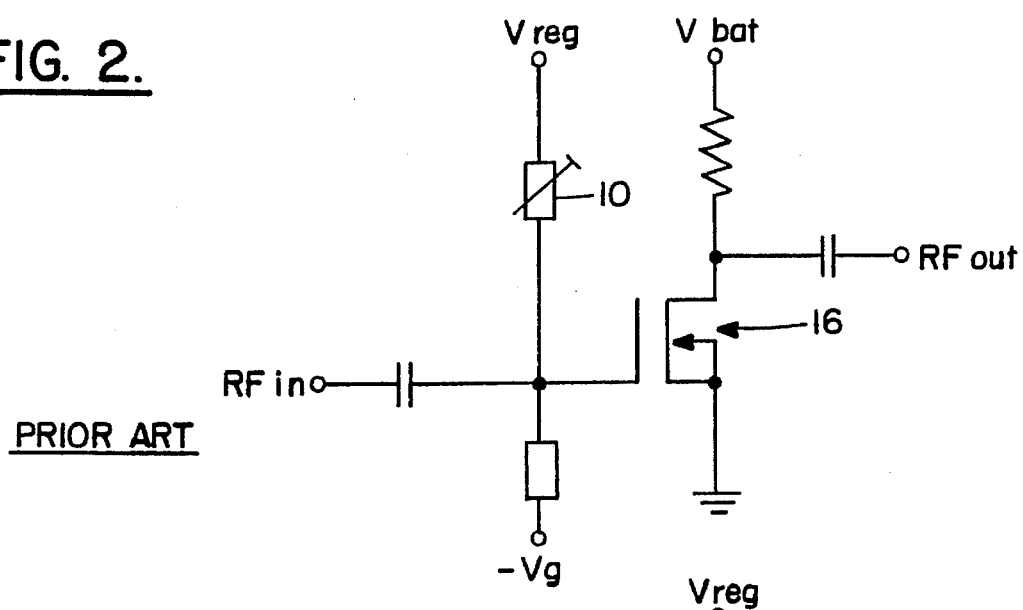
Figure 3:
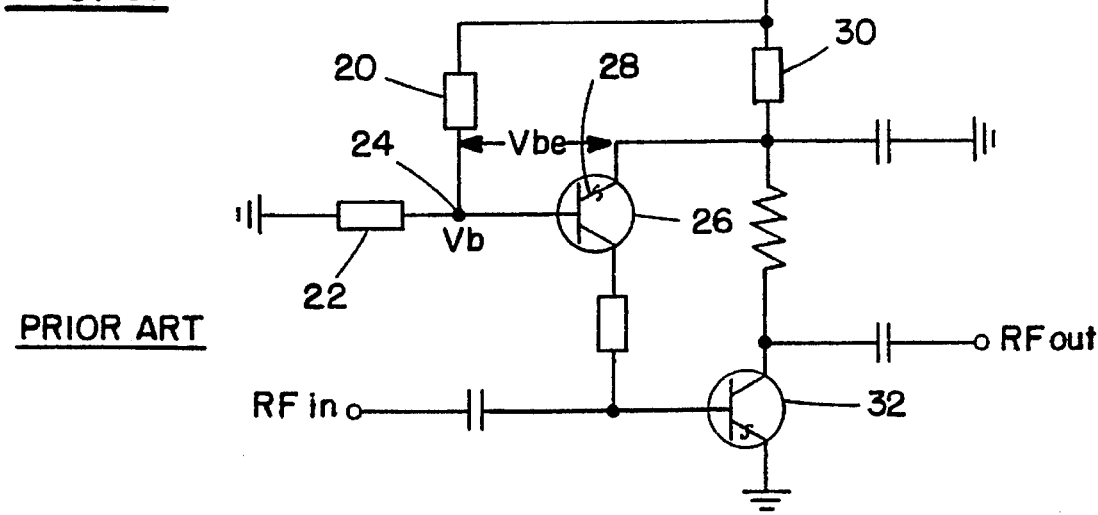

Typical known techniques for RF power amplifier bias control are illustrated in FIGS. 1, 2 and 3.

Referring to FIG. 1, a bias control stage using bi-polar technology is shown including a voltage regulator supply Vreg and a DC voltage supply Vbat. A trimmer resistor 10 is tuned until transistor 12 has reached an optimum current for the desired operation. A diode 14 is used to compensate the temperature dependence of the transistor 12. To tune the circuit of FIG. 1 for a number of different power levels that may be employed in actual operation of the circuit, different power levels of Vreg can be provided, such as from a digital-to-analog converter, and the circuit is tuned for each power level during the manufacture of the circuit. Each of the values of current are stored in a read-only memory. If later, the transistor 12 has to be changed, the tuning would have to be done again.

FIG. 2 illustrates a bias control circuit similar to that of FIG. 1 but using a GaAsFET device 16 instead of bipolar device 12. The circuit of FIG. 2 uses the same tuning procedures and includes the same temperature compensation as FIG. 1.

The drawbacks with the techniques of FIGS. 1 and 2 are that the biasing needs tuning during circuit manufacture and if the power transistor is later changed, new tuning is needed. Also, the temperature compensation is difficult, particularly for the bipolar stage.

For low signal RF amplifiers, an active bias circuit is often employed. A typical active bias circuit is illustrated in FIG. 3.

In FIG. 3, a resistive divider composed of resistors 20 and 22 provides a base voltage Vb at node 24 to transistor 26. The emitter 28 of transistor 26 is connected to the low voltage end of resistor 30. Transistor 26 controls the bias current (the base current) of transistor 32 in such a manner that the voltage at the emitter 28 of transistor 26 is a base-emitter voltage (Vbe) higher than Vb (that is, Vb & Vbe) so the voltage over resistor 30 is Vreg−(Vb+Vbe) and the current through resistor 30 and transistor 32 is Vreg−(Vb+Vbe) divided by the value of resistor 30. Transistor 32 can be changed by adjusting the value Vb and the only temperature dependence is the Vbe voltage which is easy to compensate by making Vb also temperature dependent.

The problems with an active biasing circuit such as that of FIG. 3 is that if a battery voltage is used instead of a regulated voltage Vreg, the current is dependent on the battery voltage and also the voltage drop over resistor 30 is usually too high for the power amplifier, which results in increased power loss and lower output power.

Figure 4:
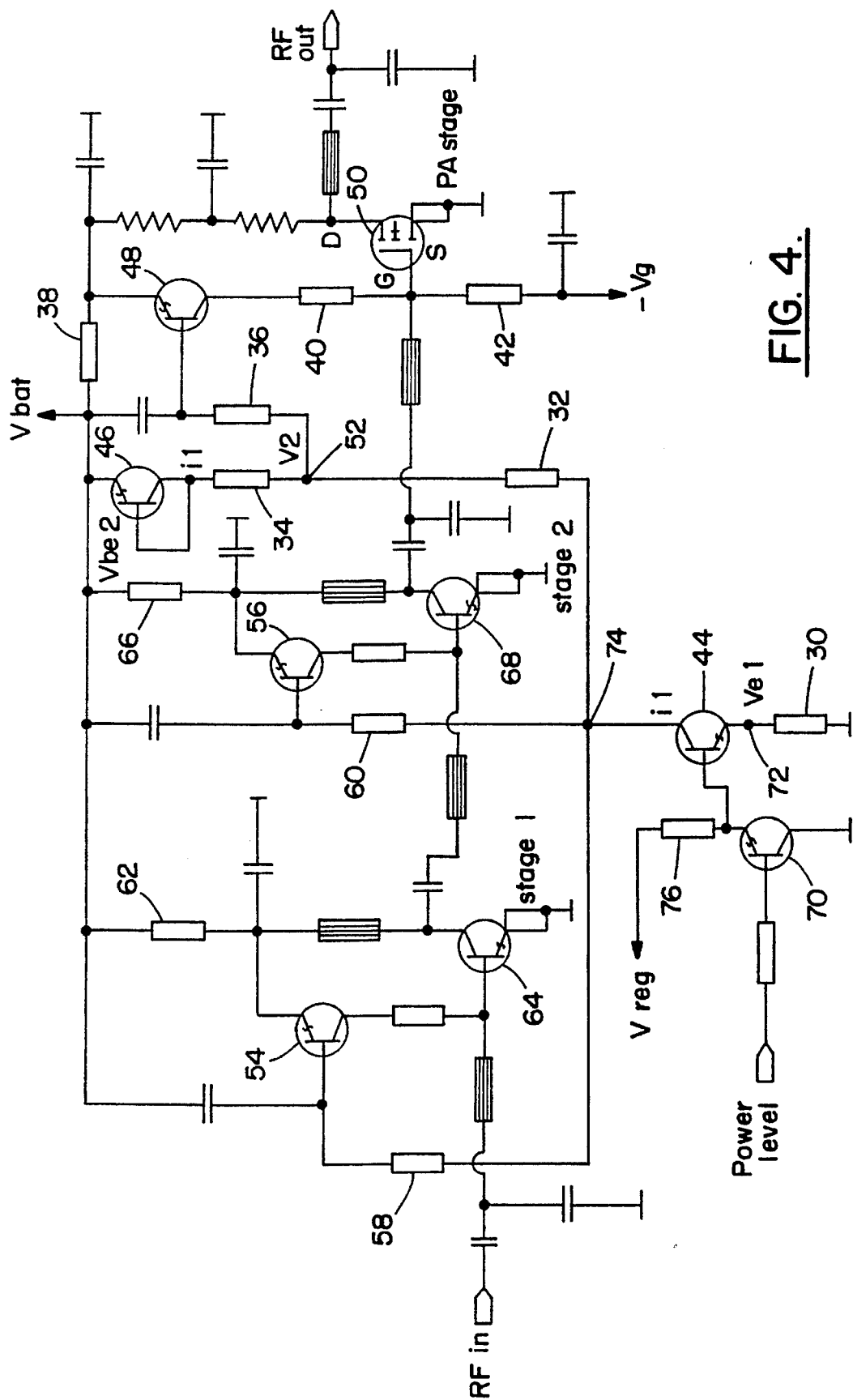
FIG. 4 is a schematic circuit illustration of an RF power amplifier structure having a bias control circuit according to the principles of the present invention.

The aforesaid problems associated with the circuits of FIGS. 1, 2 and 3 are overcome by the bias control circuit embodiment of the present invention illustrated in FIG. 4.

FIG. 4 shows a bias circuit for an RF transistor power amplifier 50 including resistors 30, 32, 34, 36, 38, 40 and 42 and transistors 44, 46 and 48. Transistor 44 and resistor 30 form a current generator, the current i1 generated being Ve44 divided by the value R30 of resistor 30. This current flows through resistors 32 and 34 and transistor 46 connected as a diode. The voltage between Vbat and node 52 (V2) is Vbe46+(i1×R34) where Vbe46 is the base to emitter voltage of transistor 46 and R34 is the value of resistor 34. An alternative series connection is possible wherein resistor 36 is connected to $V_{bat}$ and transistor 46 is connected to node 52.

Transistor 48 is part of the bias control circuit for the RF transistor power amplifier 50. The emitter of transistor 48 is connected to the low voltage end of resistor 38 and the drain feeding circuit of transistor power amplifier 50. Resistor 38 functions as a current-to-voltage converter. The collector current of transistor 48 controls the gate voltage of transistor amplifier 50 in such a manner that the voltage drop over resistor 38 is the Vbe voltage of bias control transistor 48 less than the voltage between Vbat and V2, so the voltage drop over resistor 38 is the Vbe46 of transistor 46+i1×R34 (the resistance of 34) minus the Vbe48 of transistor 48. A dual transistor is used for transistor diode 46 and bias control transistor 48 so they are quite identical and are both at same temperature. Resistor 36 is used to reject possible RF-frequencies and has almost no voltage drop over it, because only the base current of transistor 48 is flowing through it. Resistor 36 may not be required in all applications. Resistor 42 is dimensioned so that the current through bias control transistor 48 equals i1 at highest power amplifier current. Thus, with highest current level (needed for highest RF power) Vbe voltage of transistors 46 and 48 are equal and cancel each other. The voltage drop over resistor 38 is i1×R34 and the RF power amplifier current is i1×R34/R38. Because Vbe of transistors 46 and 48 are cancelled there is no temperature dependence on power amplifier 50 current (i50) and a very small-value for resistor 38 can be used and still the power amplifier current (i50) is exactly controlled with i1. Of course the power amplifier transistor 50 can also be a bipolar device instead of the FET that is shown in FIG. 4.

The stages 1 and 2 are also controlled with the same current i1. The controlling transistors are 54 and 56. Because the power levels for stages 1 and 2 are smaller, a higher voltage drop over their collector resistors is allowed. An additional voltage drop is affected with resistor 32, (the voltage drop across resistor 32 is i1×R32). The voltage between Vbat and node 74 is Vbe2+ i1×R34+ i1×R32. Resistors 58 and 60 are used for rejecting RF signals and do not affect the DC levels at the bases of transistors 54 and 56. The current through resistor 62 and transistor 64 is [Vbe2+ i1×(R34+ R32)–Vbe54]/R54 and through stage 2 resistor 66 and transistor 68 is [Vbe2+i1 ×(R34+ R32)– Vbe56]/R66. The currents through transistors 54 and 56 are not the same as through transistor 46 and also their temperatures are different because they are not on the same chip as transistor 46. Because of a higher voltage drop over resistors 62 and 66, a small difference between Vbe54 and Vbe3 or between Vbe2 and Vbe54 has only a minor influence to the currents of transistors 64 and 68. So also these currents are quite accurately controlled with i1.

The voltage Vbat has no effect on the biasing currents with the circuit of FIG. 4 because the control voltage referred to ground is mirrored to a scaled voltage referred to Vbat. This voltage mirroring is done so that first the control voltage is changed to i1 and this current is again changed to voltage with resistors 34 and 32, but the reference for this new voltage (i1×(R34+ R32)) is Vbat, and Vbe2 is summed to this mirrored voltage to compensate the temperature dependence of the control transistors base emitter voltage.

A simple means for the voltage to current conversion with minimal temperature dependence is to use a PNP transistor 70 as an emitter follower and take the base voltage for transistor 44 from the emitter of transistor 68. With this connection the voltage at node 72 (Ve1) is equal with the power level voltage and the current i1= Ve1/R30= Vpowerlevel/R30. Of course there are many other possibilities to do the voltage to current conversion.

Because there is an exact and simple mathematical relationship between power level voltage and the currents for each RF-stage there is no need to adjust the currents in production or if the RF transistor is changed. Instead fixed values for power levels can be used. These can be the same values which are used in the power control loop for different power levels, or these values can be taken from a separate DA converter.

While a preferred embodiment of the invention has been disclosed in detail, it should be understood by those skilled in the art that various other modifications may be made to the illustrated embodiment without departing from the scope of the invention as described in the specification and defined in the appended claims.

I claim:

1. A biasing means for providing linear operation of an RF amplifier means comprising a power amplifier circuit including at least a power amplifier stage containing a power transistor 50, and a voltage source $V_{bat}$ connected to said at least power amplifier stage, a bias circuit for said power amplifier circuit including a current generator circuit for generating a current i1, a first resistor means 34 connected in series with a transistor diode 46 having a base an emitter and a collector electrode, said first resistor 34 and said transistor diode 46 being connected to said voltage source $V_{bat}$ and to said current generator circuit at a first node 52, a bias control transistor 48 having a base an emitter and a collector electrode said bias control transistor 48 being connected to said power transistor 50 of said power amplifier stage, a current-to-voltage converter means 38 connected between said bias control transistor 48, said voltage source $V_{bat}$ and said power transistor 50, said bias control transistor 48 being responsive to the voltage at first node 52 for providing a bias control current signal to said power transistor 50, and wherein the base to emitter voltage of said transistor diode 46 and the base to emitter voltage of said bias control transistor 48 are determined by said generated current i1 to be substantially equal and cancel each other.

2. A biasing means according to claim 1 further including a second resistor means 36 connected between said bias control transistor 48 and said first node 52.

3. A biasing means according to claim 1 wherein said current-to-voltage converter means 38 is a resistor means.

4. A biasing means according to claim 1 further including a series resistor means 40, 42 connected to said bias control transistor 48 and to said power transistor 50.

5. A biasing means according to claim 1 further including at least a first and a second transistor amplifier stage connected to said power amplifier stage wherein said first transistor amplifier stage includes a transistor 64 and said second transistor amplifier stage includes a transistor 68, wherein said bias circuit for said power amplifier circuit includes a bias control transistor 54 connected between said transistor 64 of said first transistor amplifier stage and current generator circuit and a bias control transistor 56 connected between said transistor 68 of said second transistor amplifier stage and said current generator.

6. A biasing means according to claim 1 wherein said current generator circuit includes a transistor 44 connected in series with a resistor 30 and a power input signal connected to said transistor 44 to provide said generated current i1.

7. A biasing means according to claim 1 wherein said transistor diode 46 has its emitter electrode connected to said voltage source $V_{bat}$ and its said base and collector electrodes connected to said first resistor means 34, and wherein said bias control transistor 48 has its said emitter electrode connected to said current-to-voltage converter means 38, its said collector electrode connected to said series resistor means 40, 42 and its said base electrode connected to said node 52.

8. A biasing means according to claim 5 wherein said bias control transistor 54 of said first transistor amplifier stage includes an emitter a collector and a base electrode, said bias control transistor 56 of said second transistor amplifier includes an emitter, a collector and a base electrode and wherein said current generator is connected to said base electrodes of said bias control transistors 54 and 56, wherein said current generator circuit is connected to said first node 52 through a second resistor means 32 and wherein said second resistor means 32 and said bias control transistors 54 and 56 are connected to said current generator circuit at a second node 74.

9. A biasing means according to claim 6 wherein said transistor 44 of said current generator circuit includes a base, an emitter and a collector electrode, said emitter electrode being connected to said resistor 30 and wherein said current generator circuit further includes a PNP transistor 70, having a base electrode connected to a power level input signal, an emitter electrode connected to said base electrode of said transistor 44 and through a resistor 76 to a source or regulating voltage $V_{reg}$.

10. A biasing circuit according to claim 9 wherein said collector of said PNP transistor 70 and said resistor 30 are connected to a source of ground voltage and wherein said series resistor means 40, 42 is connected to a source of negative voltage.

11. A biasing circuit according to claim 5 wherein said voltage source $V_{bat}$ is connected to said bias control transistors 54 and 56 of said first and second amplifier stages by second and third bias control resistor means 62 and 66 respectively.

12. A biasing circuit according to claim 1 wherein the voltage drop over said current-to-voltage converter 38 is substantially equal to the base-to-emitter voltage of transistor diode 46 plus the value of the current from said current generator times the value of first resistor means 34 minus the base-to-emitter voltage of said bias control transistor 48.

* * * * *

UNITED STATES PATENT AND TRADEMARK OFFICE
CERTIFICATE OF CORRECTION

PATENT NO. : 5,493,255
DATED : Feb. 20, 1996
INVENTOR(S) : Murtojarvi It is certified that error appears in the above-identified patent and that said Letters Patent is hereby corrected as shown below:

On the title page, item [22]:
The Filing Date should be "Mar. 21, 1995".

Signed and Sealed this

Second Day of July, 1996

*Attest:*

BRUCE LEHMAN

*Attesting Officer*  *Commissioner of Patents and Trademarks*